July 7, 1953 | C. P. GADSDEN ET AL | 2,644,860

HIGH-FREQUENCY WIDE BAND AMPLIFIER

Filed Feb. 5, 1946

CHRISTOPHER P. GADSDEN
ALAN B. MACNEE
HENRY WALLMAN
*INVENTORS.*

BY [signature]

ATTORNEY

Patented July 7, 1953 2,644,860

UNITED STATES PATENT OFFICE 2,644,860

HIGH-FREQUENCY WIDE BAND AMPLIFIER

Christopher P. Gadsden, Belmont, Alan B. Macnee, Boston, and Henry Wallman, Cambridge, Mass., assignors, by mesne assignments, to the United States of America as represented by the Secretary of the Navy Application February 5, 1946, Serial No. 645,622

7 Claims. (Cl. 179—171)

This invention relates in general to electronic amplifiers and more particularly to low-noise electronic amplifiers.

In substantially all fields of radio a primary consideration is the improvement of the ratio of signal-to-noise. Radio noise which is introduced at the input of the amplifier, where the signal level is extremely low, is of course the noise which is most apparent at the output. There are many illustrations in the prior art of methods of reducing the noise figure of the first few stages to a value as low as possible; the noise figure being defined as the power ratio of the total output noise to the minimum theoretical noise.

A considerable number of types of input circuits have been utilized in the past, and have included both pentode and triode electron tube stages. Triodes are inherently less noisy than pentodes because they have fewer electrodes at which random "shot" noise can arise. Pentodes, however, are capable of higher gains and when they are used, usually only the noise arising at the first stage is significant. When triodes are used for the reason that they are less noisy than pentodes, the gain of the first triode must be kept low to achieve good stability and thus the noise introduced by the second stage is almost as significant as that introduced by the first.

The object of this invention is to provide an amplifier utilizing two triode tubes which amplifier is so designed, that the noise figure of the second tube is particularly low, whereby the only significant amplifier noise is that small amount arising from the first tube which, because it is a triode, is in itself particularly quiet.

Other and further objects of this invention will be apparent from the following specification when taken with the accompanying drawing in which:

Fig. 2 is a schematic diagram of the equivalent alternating current circuit of the amplifier with the direct current connections omitted.

Figure 1:
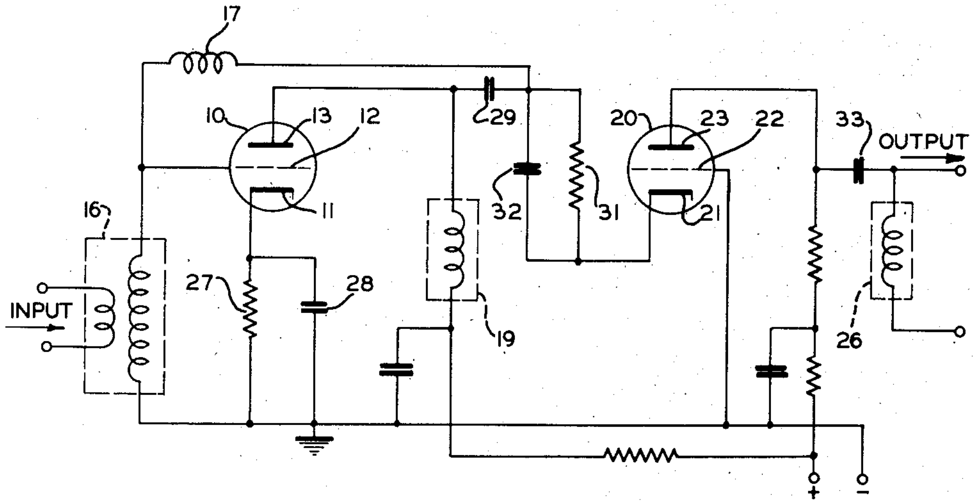
Fig. 1 is a schematic diagram of the amplifier.
Figure 1:
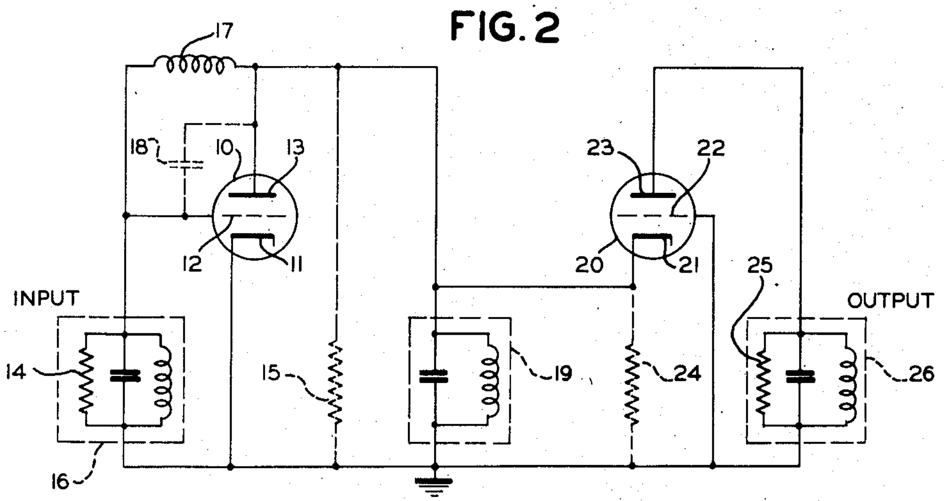

The embodiment of this invention as shown in Fig. 1 represents the input circuit stages of a high-frequency wide-band amplifier. In this illustration the input impedance 16 is coupled to grid 12 of the first amplifier tube 10 which has its cathode 11 grounded through bias resistor 27 and condenser 28. Interstage coupling between the two triodes 10 and 20 may be effected by utilizing, for example, a single tuned network, diagrammatically represented in the drawing by box 19, connected in the anode circuit of triode 10 and coupled via condenser 29 and bias resistor 31 and its bypass condenser 32 to the cathode 21 of triode 20. In its simplest form, the coupling network may consist of a single inductance and a single capacitance in parallel. The latter element need not be a separate condenser but may be supplied by the output and input tube capacitances of triodes 10 and 20, respectively. The plates of tubes 10 and 20 are energized from a conventional power source as shown. Grid 22 of tube 20 is grounded, and thus the equivalent input resistance of tube 20 is low, being approximately equal to the reciprocal of the transconductance ($g_m$) of the tube. The output from plate 23 of tube 20 is coupled by condenser 33 to a conventional tuned output circuit 26 to the grid of the following amplifier (not shown). Inductance 17 is connected between grid 12 and plate 13 of triode 10 through blocking condenser 29 and its value is adjusted to cancel out the grid-to-plate capacitance of triode 10 at the center frequency of the pass-band of the amplifier. The function of this neutralizing inductance 17 is not to provide stability, since as will be made clear below, the amplifier is stable without inductor 17, but to improve the noise figure.

A qualitative analysis of the noise behavior of the double triode input circuit can best be shown by considering the mathematical relations involved and the equivalent alternating current signal circuit, Fig. 2. Because of the similarity of Figs. 1 and 2, corresponding circuit elements have been designated by the same reference numerals. The following expressions are approximately valid at band center, and use is made of the generally accepted relation that the equivalent noise resistance of a triode is 2.5 times the reciprocal of the tube's transconductance.

The symbols used in the following expressions are:

$NF$=noise figure of an amplifier as defined above;
$R_n$=equivalent noise resistance of a triode taken equal to $$\frac{2.5}{g_m}$$

$g_m$=transconductance of the tube;
$R_s$=equivalent resistance of the input source;
$A$=available power gain of the amplifier;

and the subscript numbers refer to the corresponding numbered elements of the drawings, with the exception of subscript 30 which is used to denote the combined noise figure and combined gain of the two stages of the amplifier.

The general expression for the noise figure of an amplifier with either cathode or grid grounded, and with neither feedback nor transit-time effects is $$NF=1+\frac{R_n}{R_s} \quad (1)$$

and thus the first and second stage noise figures may be expressed as $$NF_{10}=1+\frac{2.5}{g_{m10}R_{14}} \quad (2)$$

and $$NF_{20}=1+\frac{2.5}{g_{m20}R_{15}} \quad (3)$$

where $R_{14}$ is the resistive component of impedance 16 as seen looking back from grid 12 of tube 10, and $R_{15}$ is the equivalent plate resistance of tube 10 as seen looking back from cathode 21 of tube 20.

The relation for combining noise figures is $$NF_{30}=NF_{10}+\frac{NF_{20}-1}{A_{10}} \quad (4)$$

and the expression for the first stage power gain $A_{10}$, assuming the equivalent input resistance $R_{24}$ is equal to $$\frac{1}{g_{m20}}$$

is $$A_{10}=\frac{(g_{m10})^2}{g_{m20}}\cdot R_{14} \quad (5)$$

thus, combining (4) and (5) for the overall noise figure, $$NF_{30}=1+\frac{2.5}{g_{m10}R_{14}}+\frac{2.5}{(g_{m10})^2R_{14}R_{15}} \quad (6)$$

and the equation for overall gain reads $$A_{30}=(g_{m10})^2R_{14}R_{25} \quad (7)$$

To make the first stage noise figure as low as possible the input impedance $R_{14}$ is made large in accordance with Equation 2. $R_{14}$ is the source impedance of the input circuit and is made as large as bandwidth considerations will permit. The input capacitance is kept low by making the first stage gain low. The ultimate limitation, however, on the maximum size of $R_{14}$ is imposed by the tube capacitances involved, and also by the presence of induced grid noise in the input to tube 10.

Because of the low input impedance 24 of tube 20, the amplification of tube 10 is very low, of the order of unity. This has the very important consequence of making the operation of tube 10 very stable, even though it is a triode. Another consequence of the low amplification of tube 10 is a low input capacitance for tube 10 (that is the "Miller effect" is small).

In Equation 6 the term $$\frac{2.5}{(g_{m10})^2R_{14}R_{15}}$$

is extremely small. This shows that $NF_{30}$ is, very closely, as good as $NF_{10}$, despite the low gain of tube 10; i. e. the grounded-cathode into grounded-grid circuit combination has, very closely, as good a noise figure as does the grounded-cathode triode stage alone.

Equation 7 shows that the two triode combination 10, 20, has as much gain as would a single pentode having a transconductance of $g_{m10}$.

The low shunt impedance $R_{24}$ introduced across the tuned coupling circuit 19 by tube 20 causes the interstage circuit to have a wide bandwidth. The value of resistance 25 in the output circuit 26 is chosen primarily to give the second triode stage a suitably broad band.

Summarizing the above, the two stage amplifier shown in the figures considerably improves the overall noise figure, while providing the desired circuit bandwidth.

It is not meant that this invention be limited to the details as shown, but is to be limited only by the following claims.

What is claimed is:

1. A high frequency, wide band amplifier circuit comprising, first and second triode electron tubes each having an anode, a cathode and a single grid, a relatively high resistance input circuit connected between the grid of said first tube and ground, the cathode of said first tube being effectively grounded at radio frequencies whereby said first tube provides a high impedance from anode to ground, a tuned coupling circuit connected in the anode circuit of said first tube and in the cathode circuit of said second tube, means directly connecting the grid of said second tube to ground whereby said second tube has a low input impedance, and a tuned output circuit having a relatively high impedance connected to the anode of said second tube.

2. An amplifier having a low noise figure and relatively broad band operation comprising, in combination, first and second triode electron tubes each having an anode, a cathode and a single grid, an input circuit having a large effective impedance connected between the grid of said first tube and ground, the cathode of said first tube being effectively grounded for radio frequency current flow, a resonant coupling circuit comprising a parallel connection of an inductor and a capacitor, the high potential terminal of said coupling circuit being connected to the anode of said first tube and the cathode of said second tube and the low potential terminal of said coupling circuit being effectively grounded for radio frequency current flow, the grid of said second tube being grounded for radio frequency current flow whereby said second tube provides an effective resistance in shunt with said coupling circuit of a value approximately equal to the reciprocal of the transconductance of said second tube, and a relatively high impedance output circuit connected in the anode circuit of said second tube.

3. A broad band amplifier comprising, in combination, first and second triode electron tubes each having an anode, a cathode and a grid, an input circuit having a relatively high impedance connected between the grid of said first tube and ground, the cathode of said first tube being effectively grounded for radio frequency current flow, an inductor connected between the anode and grid of said first tube of a value to cancel the grid-to-anode capacitance of said first tube at the center frequency of said band, a resonant coupling circuit effectively connected between the anode of said first tube and ground for radio frequency current flow and connected at its high potential terminal to the cathode of said second tube, the grid of said second tube being grounded for radio frequency current flow, and a resonant output circuit connected in the anode circuit of said second tube.

4. A wide band, high frequency amplifier having a low noise figure comprising, in combination, first and second triode electron tubes each having only an anode, a cathode and a control grid, a tuned input circuit having a relatively high impedance connected between the grid of said first tube and ground, the cathode of said first tube being effectively grounded for high frequency current flow, a resonant coupling circuit comprising a parallel combination of an inductor and a capacitor, said combination being connected at its high potential terminal to the anode of said first tube and the cathode of said second tube and at the low potential terminal to ground, the grid of said second tube being grounded for radio frequency current flow whereby said second tube provides a resistance of relatively low value in shunt with said coupling circuit to cause said coupling circuit to have a wide band width, a relatively high impedance output circuit connected between the anode of said second tube and ground, and an inductor connected between the anode and grid of said first tube of a value to cancel the grid-to-anode capacitance of said first tube at the center frequency of said band.

5. A wide band, high frequency amplifier having a low noise figure comprising, in combination, first and second triode electron tubes each having only an anode, a cathode and a control grid and having low inherent equivalent noise resistance, a tuned input circuit having a relatively wide pass band and relatively high resistive impedance connected between the grid of said first tube and ground, an inductance having a value equal to the grid-to-anode capacitance of said first tube at the mid-frequency of said band connected between the anode and grid of said first tube, the cathode of said first tube being effectively grounded for high frequency current flow, a tuned coupling circuit comprising a parallel combination of inductance and capacitance connected between the anode of said first tube and ground for high frequency current, means connecting the high potential terminal of said coupling circuit to the cathode of said second tube, the grid of said second tube being grounded for radio frequency current flow whereby said second tube provides a resistance having a value substantially equal to the reciprocal of the transconductance of said second tube in shunt with said coupling circuit to cause said coupling circuit to have a wide bandwidth, and a tuned output circuit having a relatively high resistive impedance connected between the anode of said second tube and ground.

6. A wide band, high frequency amplifier comprising, first and second electron tubes each having only an anode, a cathode, and a grid, means connecting the anode of said first tube directly to the cathode of said second tube with respect to the frequencies to be amplified, means for maintaining the cathode of said first tube and the grid of said second tube at ground potential with respect to the frequencies to be amplified, a tuned input circuit having a high impedance connected between the grid of said first tube and ground, an interstage tuned coupling circuit having low effective impedance relative to the impedance of said input circuit connected between said common connection of anode and cathode of said first and second tubes, respectively, and ground, and a tuned output circuit having a high impedance relative to said coupling circuit connected between the anode of said second tube and ground.

7. A two-stage, intermediate frequency amplifier having a low noise figure and a wide band width comprising, in combination, first and second tubes each having an anode, a cathode and a control grid, a relatively high resistance input circuit connected between the grid of said first tube and ground, the cathode of said first tube being effectively grounded at the operating frequencies of said amplifier whereby said first tube presents a high impedance from anode to ground, an inductance element in the anode circuit of said first tube, means directly connecting the control grid of said second tube to ground whereby said second tube has a low input impedance, means for coupling the cathode of said second tube to said inductance whereby the latter element provides interstage coupling between said tubes by tuning the output and input tube capacitances of said first and second tubes, respectively, to the center frequency of said band width, said first tube having a low gain because of the mismatch between its high impedance from plate to ground and the low input impedance of said second tube and a tuned output circuit having a relatively high impedance connected in the anode of said second tube.

CHRISTOPHER P. GADSDEN.
ALAN B. MACNEE.
HENRY WALLMAN.

References Cited in the file of this patent

UNITED STATES PATENTS

| Number | Name | Date |
|---|---|---|
| 1,325,879 | Nichols | Dec. 23, 1919 |
| 2,045,315 | Smith | June 23, 1936 |
| 2,058,432 | Ferris | Oct. 27, 1936 |
| 2,093,078 | Heising | Sept. 14, 1937 |
| 2,298,297 | Jacob | Oct. 13, 1942 |
| 2,298,629 | Schaper | Oct. 13, 1942 |
| 2,463,229 | Wheeler | Mar. 1, 1949 |